(12) United States Patent
Ilkov

(10) Patent No.: US 7,705,681 B2
(45) Date of Patent: Apr. 27, 2010

(54) APPARATUS FOR COUPLING AT LEAST ONE OF A PLURALITY OF AMPLIFIED INPUT SIGNALS TO AN OUTPUT TERMINAL USING A DIRECTIONAL COUPLER

(75) Inventor: Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/104,810

(22) Filed: Apr. 17, 2008

(65) Prior Publication Data

US 2009/0261900 A1 Oct. 22, 2009

(51) Int. Cl.
*H03F 3/68* (2006.01)
(52) U.S. Cl. .................................. 330/295; 330/124 R
(58) Field of Classification Search ............... 330/295, 330/124 R, 84, 126
See application file for complete search history.

(56) References Cited

U.S. PATENT DOCUMENTS

| | | | | | |
|---|---|---|---|---|---|
| 4,048,579 | A | * | 9/1977 | Carlsson | 330/151 |
| 4,053,848 | A | * | 10/1977 | Kleische | 330/53 |
| 4,064,464 | A | * | 12/1977 | Morse | 330/53 |
| 5,825,260 | A | | 10/1998 | Ludwig et al. | |
| 5,999,056 | A | | 12/1999 | Fong | |
| 6,147,559 | A | | 11/2000 | Fong | |
| 6,211,737 | B1 | | 4/2001 | Fong | |
| 7,038,539 | B2 | * | 5/2006 | Khanifar et al. | 330/136 |
| 7,161,425 | B2 | * | 1/2007 | Hodgetts et al. | 330/124 R |

FOREIGN PATENT DOCUMENTS

EP 0 790 660 A2 8/1997

OTHER PUBLICATIONS

Fong, K.L., "Dual-Band High-Linearity Variable-Gain Low-Noise Amplifiers for Wireless Applications," IEEE International Solid-State Circuits Conference, 1999, 11 pages, IEEE.

Fong, K.L., "Design and Optimization Techniques for Monolithic RF Downconversion Mixers," Graduate Division of the University of California, Berkeley, 1997, pp. 1-104, University of California, Berkeley.

Fong, K.L., et al., "High-Frequency Nonlinearity Analysis of Common-Emitter and Differential-Pair Transconductance Stages," IEEE Journal of Solid-State Circuits, Apr. 1998, pp. 548-555, vol. 33, No. 4, IEEE.

Hull, C.D., et al., "A Direct-Conversion Receiver for 900 MHz (ISM Band) Spread-Spectrum Digital Cordless Telephone," IEEE Journal of Solid-State Circuits, Dec. 1996, pp. 1955-1963, vol. 31, No. 12, IEEE.

(Continued)

*Primary Examiner*—Henry K Choe
(74) *Attorney, Agent, or Firm*—Slater & Matsil, L.L.P.

(57) ABSTRACT

An apparatus has an input terminal configured to receive an input signal, a network coupled to the input terminal and configured to provide a plurality of amplified input signals, and a directional coupler coupled to the network and configured to couple at least one of the plurality of amplified input signals to an output terminal.

21 Claims, 5 Drawing Sheets

OTHER PUBLICATIONS

Kivekäs, K., "Design and Characterization of Downconversion Mixers and the On-Chip Calibration Techniques for Monolithic Direct Conversion Radio Receivers," Helsinki University of Technology, Department of Electrical and Communications Engineering, Electronic Circuit Design Laboratory, Oct. 2002, pp. 2-67, Helsinki University of Technology Electronic Circuit Design Laboratory Publications.

Pruijmboom, A., et al., QUBiC3: A 0.5μm BiCMOS Production Technology, with fT=30GHz, fmax=60GHz and High-Quality Passive Components for Wireless Telecommunication Applications, IEEE BCTM 7.1, 1998, pp. 120-123, IEEE.

Wikipedia Contributors, "Power dividers and directional couplers," Date Retrieved Apr. 16, 2008, http://en.wikipedia.org/wiki/Power_dividers_and_directional_couplers.

* cited by examiner

APPARATUS FOR COUPLING AT LEAST ONE OF A PLURALITY OF AMPLIFIED INPUT SIGNALS TO AN OUTPUT TERMINAL USING A DIRECTIONAL COUPLER

TECHNICAL FIELD

Embodiments of the invention relate to an apparatus for coupling at least one of a plurality of amplified input signals to an output terminal using a directional coupler.

BACKGROUND

In radio communication systems operating with digital modulation arts amplifiers are required that provide multiple gain steps and that keep the noise figures of the amplified output low. Such Low Noise Amplifiers (LNA) also require input and output return losses independent of the gain step and high linearity also for the low gain modes. Controlling the gain of the Low Noise Amplifier by using current steering techniques shows the disadvantage of higher noise figures occurring in the low gain and medium gain modes than in the high gain modes. Throwing away some of the signal current by dumping to power supply, as is done in some designs of Low Noise Amplifiers for the low and medium gain modes, decreases the signal power, and hence degrades the noise figure by reducing the signal to noise ratio at the output of the Low Noise Amplifier. Cascade Low Noise Amplifiers change the current for the common base transistor by shunting and as a result the output return loss and the linearity degrade.

An approach has to be found that allows independent selection of the gain and the linearity of each state without effecting significantly the other parameters.

SUMMARY OF THE INVENTION

Embodiments of the invention relate to an apparatus, that includes an input terminal configured to receive an input signal, a network coupled to the input terminal and configured to provide a plurality of amplified input signals and a directional coupler coupled to the network and configured to couple at least one of the plurality of amplified input signals to an output terminal.

DETAILED DESCRIPTION OF ILLUSTRATIVE EMBODIMENTS

With reference to the accompanying FIGS. 1 to 5, explanations and embodiments relating to the apparatus for coupling at least one of a plurality of amplified input currents to an output terminal using a directional coupler and to a multiple gain step low noise amplifier will be depicted in detail below.

Figure 1:
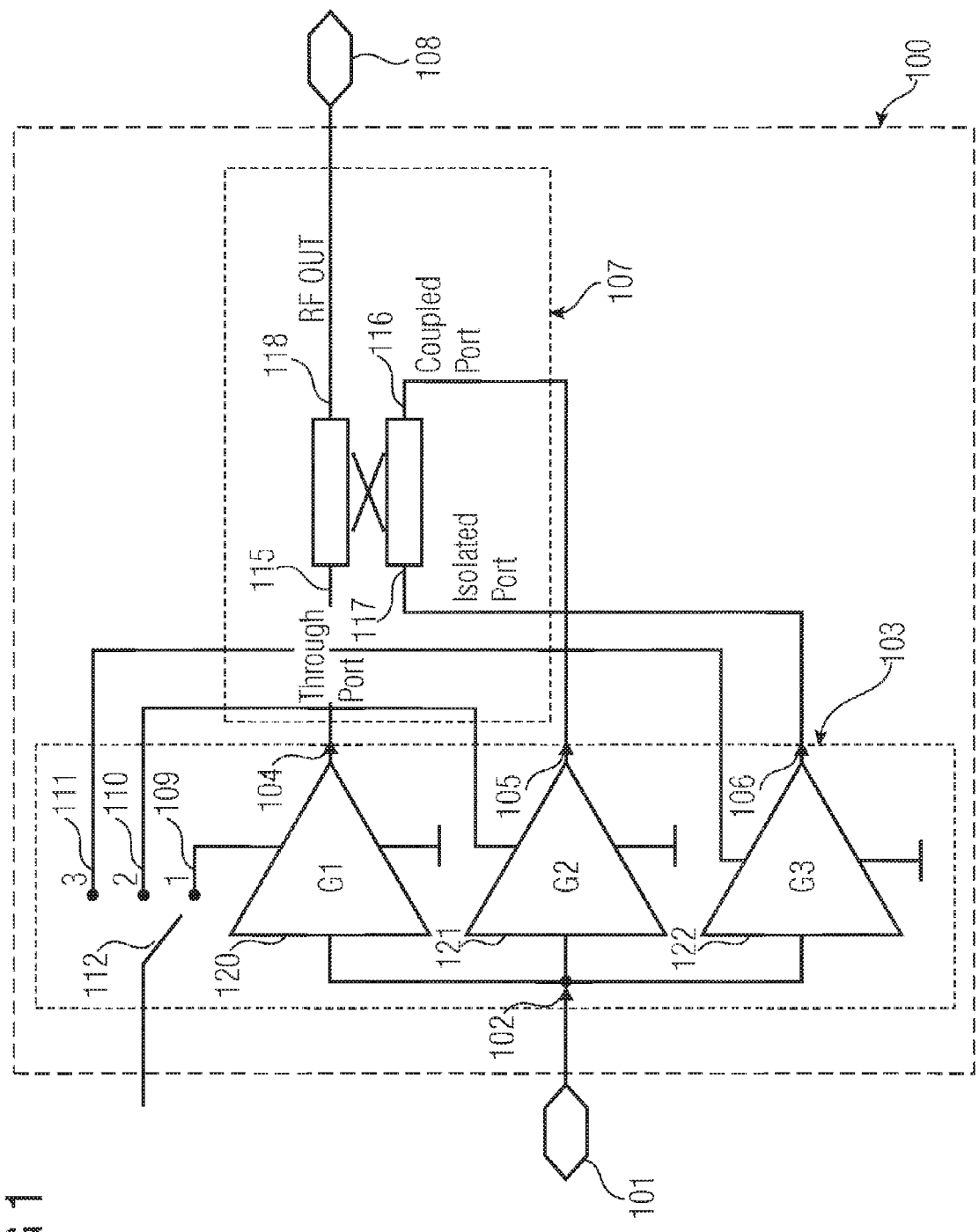
FIG. 1 shows a circuit diagram of an apparatus according to an embodiment of the invention.

FIG. 1 shows a circuit diagram of an apparatus according to an embodiment of the invention. The apparatus 100 comprises an input terminal 101 configured to provide an input current 102. The apparatus 100 further comprises a network 103 coupled to the input terminal 101 and configured to provide a plurality of amplified input currents 104, 105, 106. The apparatus 100 further comprises a directional coupler 107 coupled to the network 103 and configured to couple at least one of the plurality of amplified input currents 104, 105, 106 to an output terminal 108.

A switching of the amplified input currents 104, 105, 106 to be coupled to the directional coupler 107 can be performed by a switching element 112. The switching element 112 may comprise a plurality of switching signals, for example, a first switching signal 109, a second switching signal 110 and a third switching signal 111. The switching element 112 switches one amplified input current to the directional coupler 107 at the same time. For example, switching element 112 activates the first switching signal 109 and switches the first amplified input current 104 to the directional coupler 107, while the remaining amplified input currents 105, 106 are not activated and therefore do not pass the directional coupler 107.

In this embodiment the network 103 comprises three amplifiers, a first amplifier 120 having a gain G1 and amplifying the input current 102 to the first amplified input current 104, a second amplifier 121 having a gain G2 and amplifying the input current 102 to the second amplified input current 105 and a third amplifier 122 having a gain G3 and amplifying the input current 102 to the third amplified input current 106.

The directional coupler 107 comprises a through port 115, a coupled port 116, an isolated port 117 and an output port 118. In this embodiment of the invention the through port 115 is connected to an output of the first amplifier 120, the coupled port 116 is connected to an output of the second amplifier 121 and the isolated port 117 is connected to an output of the third amplifier 122. The output port 118 of the directional coupler 107 generating the output signal "RF OUT" is connected to the output terminal 108. The directional coupler 107 is a linear device with a coupling factor of, for example, K and an isolation of, for example, I. This means, the gain from the coupled port 116 to the output port 118 is K, the gain from the through port 115 to the output port 118 is 1−K and the gain from the isolated port 117 to the output port 118 is I. With G1 being the gain of the first amplifier 120, G2 being the gain of the second amplifier 121 and G3 being the gain of the third amplifier 122, the three gain steps of the apparatus 100 result in G1*(1−K) for gain step 1, G2*K for gain step 2 and G3*I for gain step 3. The gain steps are related to the amplification of the input current 102 to the output terminal 108. Examples for the coupling factor K are 8 to 10 dB and for the isolation are around 20 dB. Examples for the frequency range are 1 to 6 GHz.

An advantage of the directional coupler 107 according to embodiments of the invention is its low noise figure at the output port 118. As the directional coupler 107 throws no signal current away as it dumps no signal to the power supply the noise signal in dB, defined as signal to noise ratio at input in dB minus signal to noise ratio at output in dB, is independent of the gain step and improves with reducing the gain. The input current 102 is split up between different current paths, the amplified input currents 104, 105, 106 selected by the switching element 112, however, are coupled back to the output port 118 without losing signal energy and therefore no degradation of the noise figure at the output terminal 108 takes place.

While in the embodiment of the invention according to FIG. 1 three amplified input currents 104, 105, 106 are depicted, other embodiments of the invention may comprise a different number of amplified input currents.

The number of switching signals 109, 110, 111 may correspond to the number of amplified input currents 104, 105, 106, but it is also possible to use a different number of switching signals for switching the amplified input currents 104, 105, 106.

Also the switching element 112 may be configured to switch more than one input current at a time. For example, the first switching signal 109 and the second switching signal 110 may be active at the same time, switching the first amplified input current 104 and the second amplified input current 105 to the directional coupler 107 at the same time.

Figure 2:
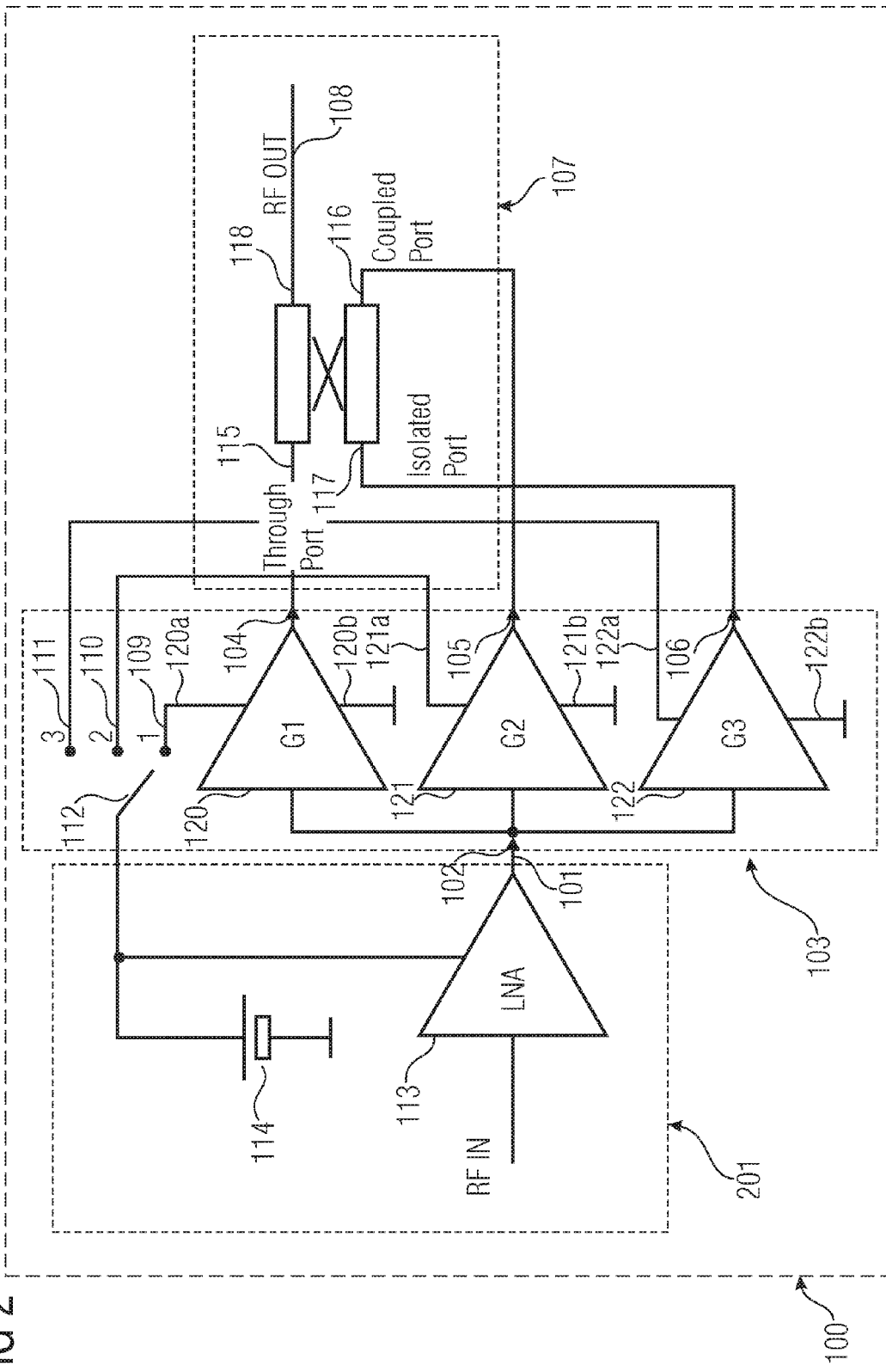
FIG. 2 shows a circuit diagram of an apparatus according to another embodiment of the invention.

FIG. 2 shows a circuit diagram of an apparatus according to another embodiment of the invention. The apparatus 100 comprises a network 103 and a directional coupler 107 corresponding to the network 103 and the directional coupler 107 according to the embodiment of FIG. 1. Additionally to the embodiment of FIG. 1 the apparatus 100 comprises a transconductance device 201 configured to generate the input current 102. The input terminal 101 is connected to the output of the transconductance device 201. The transconductance device 201 may comprise a transconductance amplifier 113, having a gain G and a transconductance supply voltage 114 configured to provide the supply voltage for the transconductance amplifier 113. The transconductance supply voltage 114 may also provide the supply voltage for the operational amplifiers 120, 121, 122 which is supplied via the switching element 112 to the respective bias inputs 120a, 121a, 122a of the operational amplifiers 120, 121, 122. The other bias inputs 120b, 121b, 122b are connected to ground. A transconductance input signal "RF IN" is amplified by the transconductance amplifier 113 generating the input current 102 provided at the input terminal 101. The overall amplification from "RF IN" to "RF OUT" results in G*G1*(1−K) for gain step 1, G*G2*K for gain step 2 and G*G3*I for gain step 3.

Figure 3:
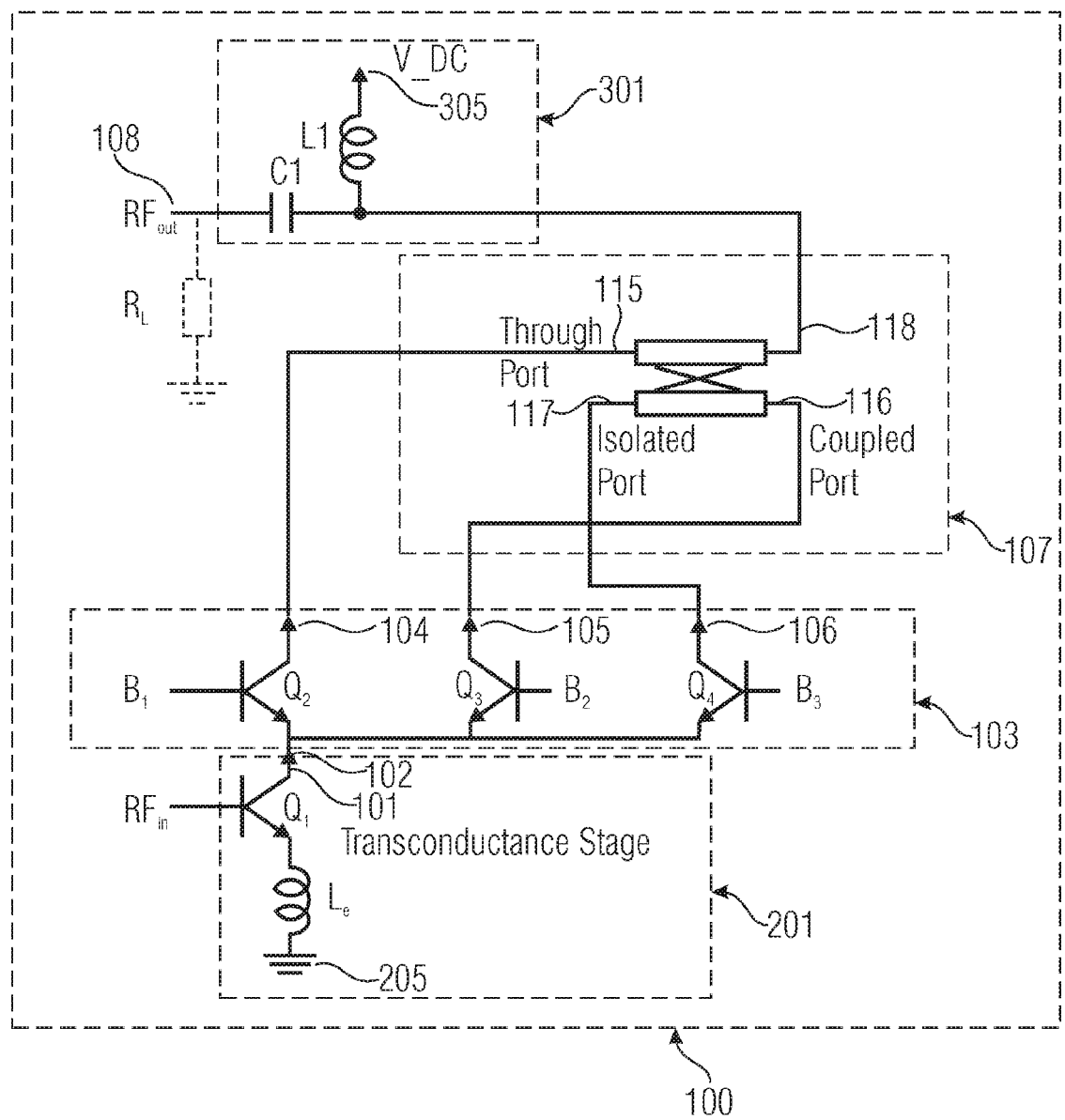
FIG. 3 shows a circuit diagram of an apparatus according to yet another embodiment of the invention.

FIG. 3 shows a circuit diagram of an apparatus according to another embodiment of the invention. The apparatus 100 comprises a directional coupler 107 corresponding to the directional coupler 107 illustrated in FIG. 1 and FIG. 2. The apparatus 100 further comprises a network 103 corresponding to the network 103 illustrated in the previous figures. However, in this embodiment of the invention the network 103 comprises a plurality of network transistors Q2, Q3, Q4 replacing the amplifiers 120, 121, 122 according to the embodiments of FIG. 1 and FIG. 2. The first network transistor Q2 corresponds to the first amplifier 120 according to the embodiment of FIG. 1 and FIG. 2. The second and third network transistors Q3 and Q4 correspond to the second and third amplifiers 121, 122, respectively according to the embodiment of FIGS. 1 and 2. The plurality of network transistors Q2, Q3, Q4 are specified as bipolar transistors having a base terminal, an emitter terminal connected to the transconductance device 201 and a collector terminal connected to the directional coupler 107.

The plurality of network transistors Q2, Q3, Q4 are controlled by a plurality of control signals B1, B2, B3 connected to their base terminals that correspond to the plurality of switching signals 109-111 according to the embodiments of FIG. 1 and FIG. 2. The control signals B1, B2, B3 may be provided by a switching element 112 according to the embodiment of FIG. 1 and FIG. 2 (not shown in this figure). The emitter terminals of the plurality of network transistors Q2, Q3, Q4 are connected to the input terminal 101 or the output of the transconductance device 201 respectively for providing the input current 102. The input current 102 is amplified by the plurality of network transistors Q2, Q3, Q4 generating the plurality of amplified input currents 104-106 which are connected to the directional coupler 107. In this embodiment the first amplified input current 104 is connected to the through port 115 of the directional coupler 107. The second amplified input current 105 is connected to the coupled port 116 of the directional coupler 107 and the third amplified input current 106 is connected to the isolated port 117 of the directional coupler 107. This corresponds to the design according to the embodiments of FIG. 1 and FIG. 2.

The apparatus 100 further comprises a transconductance device 201, or a transconductance stage. The transconductance device 201 comprises a transconductance transistor Q1 and a transconductance inductor Le. In this embodiment of the invention the transconductance transistor Q1 is a bipolar transistor having an emitter terminal connected via the transconductance inductor Le to a reference node 205 coupled to a reference potential, for example, ground potential. The collector terminal of the transconductance transistor Q1 is connected to the input terminal 101 that corresponds to the output of the transconductance device 201. A transconductance input signal "RF IN" controls the base terminal of the transconductance transistor Q1. The power of the transconductance input signal RF IN is transformed into the input current 102 produced on the collector terminal of the transconductance transistor Q1.

The apparatus 100 further comprises a matching network 301 that is connected between the output port 118 of the directional coupler 107 and the output terminal 108. In this embodiment the matching network 301 includes a matching network inductor L1, a matching network capacitor C1 and a matching network supply voltage "V_DC" 305. The matching network 301 is adapted to connect the output port 118 of the directional coupler 107 via the matching network inductor L1 to the matching network supply voltage 305 and via the matching network capacitor C1 to the output terminal 108. While in the embodiments of FIGS. 1 and 2 the output terminal 108 is directly connected to the output port 118 of the directional coupler 107 in this embodiment the matching network 301 is connected between the output terminal 108 and the directional coupler 107.

The matching network 301 is adapted to improve the linearity of the switched amplified input current passing the output port 118. The values of the capacitance and the inductance of the matching network elements C1 and L1 are configured to compensate non-linearities of the plurality of network transistors Q2, Q3, Q4. In the high gain mode provided by the first network transistor Q2 the matching network elements C1 and L1 are alternatively or additionally configured to match an impedance of the output port 118 of the directional coupler 107 close to an impedance of a load RL connected to the output terminal 108 (illustrated in dotted lines). Depending on the requirements, the matching network 301 can be optimized for providing a high linearity of the output signal RF_OUT versus an accurate matching of an impedance of the output port 118 of the directional coupler 107 to the external load RL. Especially for high gain modes a matching of the apparatus 100 to the external load RL may be preferred, whereas in low gain modes an improved linearity of the output signal at the output terminal 108 may be preferred.

Besides the matching network 301 also the directional coupler 107 can be configured to match the impedance of the output port 118 to the impedance of the external load RL. The elements of the directional coupler 107, i.e., line inductance, resistance and capacitance may be designed to match impedances of the corresponding input ports 115-117 to the external load RL. Alternatively or additionally, the elements of the directional coupler 107 may be configured to improve the linearity of the plurality of amplified input currents 104-106 passing the directional coupler 107. They may, for example, be configured to compensate the distortion applied to the plurality of amplified input currents 104-106 by the plurality of network transistors Q2, Q3, Q4. Furthermore, a non-linearity of the transconductance transistor Q1 applied to the transconductance input signal RF IN may be compensated by the elements of the directional coupler 107 or/and by the elements of the matching network 301.

While in the embodiment according to FIG. 3 the network 103 comprises three bipolar transistors Q2, Q3, Q4 in other embodiments the number of transistors is not limited to three, there can be more or less than three transistors building the plurality of network transistors.

Also the type of transistor is not limited to bipolar transistors, in other embodiments the network transistors may be field effect transistors (FET), high electron mobility transistors (HEMT), junction field effect transistors (JFET), metal oxide semiconductor field effect transistors (MOSFET), insulated gate bipolar transistors (IGBT), hetero junction bipolar transistors (HJBT) or thyristors.

In other embodiments of the invention the matching network 301 can also be connected to the through port 115, the coupled port 116 or the isolated port 117 of the directional coupler 107. In these embodiments the matching network capacitor C1 may be connected between the outputs of the plurality of network transistors Q2, Q3, Q4 and the corresponding input ports 115 to 117 of the directional coupler 107. The matching network inductor L1 may be connected between the corresponding input ports of the directional coupler 107 and the matching network supply voltage 305. Further embodiments of the invention may comprise a series connection of a matching network inductor L1 and a matching network resistor replacing the single element L1.

In another embodiment the matching network 301 is connected between the collector terminals of the plurality of network transistors Q2, Q3, Q4 and the input ports of the directional coupler 107. In this embodiment an individual matching of each gain mode to the impedance of the external load RL can be achieved. Alternatively or additionally the linearity of the different gain modes can be individually adjusted. This embodiment allows independent selection of the gain and linearity of each state without effecting significantly the other parameters.

Figure 4:
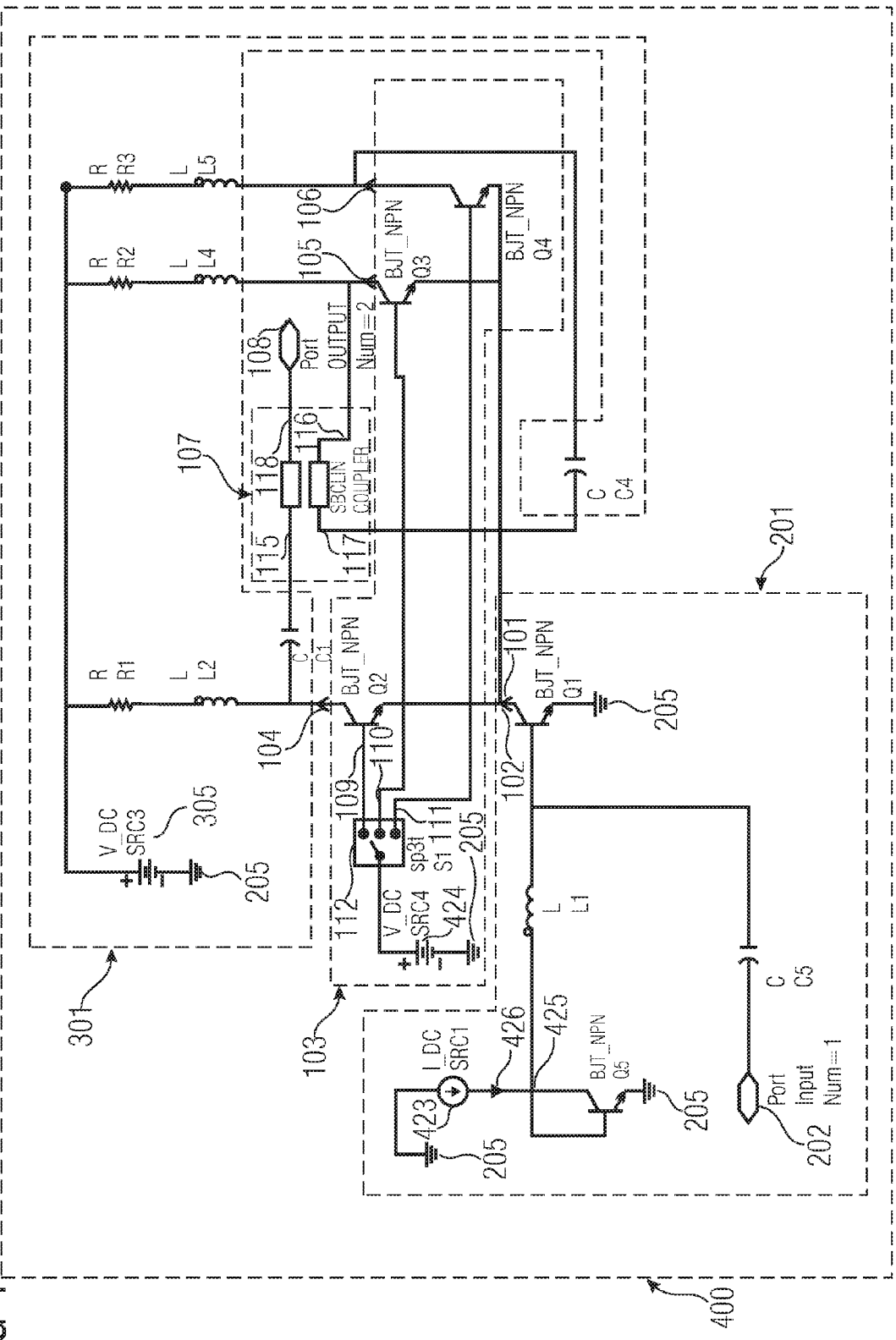
FIG. 4 shows a circuit diagram of a multiple gain step low noise amplifier according to an embodiment of the invention.

FIG. 4 shows a circuit diagram of a multiple gain step low noise amplifier according to an embodiment of the invention. The multiple gain step low noise amplifier 400 comprises an input terminal 101 configured to provide an input current 102. The multiple gain step low noise amplifier 400 further comprises a first bipolar transistor Q2, a second bipolar transistor Q3 and a third bipolar transistor Q4, each of the transistors configured to amplify the input current 102. The multiple gain step low noise amplifier 400 further comprises a switching element 112, a directional coupler 107 and an output terminal 108 connected to an output port 118 of the directional coupler 107 and configured to provide an amplified input current. Base terminals of the first Q2, second Q3 and third Q4 transistors are connected to switching outputs of the switching element 112. The switching element 112 is configured to selectively activate at least one of the bipolar transistors Q2, Q3, Q4. Emitter terminals of the first Q2, second Q3 and third Q4 bipolar transistors are connected to the input terminal 101. Collector terminals of the first Q2, second Q3 and third Q4 bipolar transistors are connected via a matching network 301 described below to input ports 115, 116, 117 of the directional coupler 107.

Elements of the multiple gain step low noise amplifier 400 with the same or an equivalent function as elements of the apparatus 100 according to the embodiments presented in the FIGS. 1 to 3 are depicted with the same reference signs. The first Q2, second Q3 and third Q4 bipolar transistor and the switching element 112 form a network 103 that corresponds to the network 103 according to FIGS. 1 to 3.

The bipolar transistors Q2, Q3, Q4 amplify the input current 102 and provide a first 104, a second 105 and a third 106 amplified input current depending on a first 109, a second 110 and a third 111 switching signal of the switching element 112. The switching element 112 may provide a bias signal to the switched bipolar transistor by connecting the base terminal of the switched bipolar transistor to a switching element supply voltage 424.

In this embodiment of the invention a matching network 301 is configured to connect the outputs of the network 103 to the inputs of the directional coupler 107. The collector terminal of the first bipolar transistor Q2 is connected via a matching network first capacitor C1 to the through port 115 of the directional coupler 107. The collector terminal of the second bipolar transistor Q3 is directly connected to the coupled port 116 of the directional coupler 107. The collector terminal of the third transistor Q4 is connected via a matching network second capacitor C4 to the isolated port 117 of the directional coupler 107. The collector terminal of the first bipolar transistor Q2 is additionally connected via a series connection of a matching network first resistor R1 and a matching network first inductor L2 to a matching network supply voltage "V_DC" 305. The collector terminal of the second bipolar transistor Q3 is additionally connected via a series connection of a matching network second resistor R2 and a matching network second inductor L4 to the matching network supply voltage 305. The collector terminal of the third bipolar transistor Q4 is additionally connected via a series connection of a matching network third resistor R3 and a matching network third inductor L5 to the matching network supply voltage 305. The coupling capacitors C1 and C4 and the series connections of the matching network resistors R1, R2, R3 and inductors L2, L4, L5 are configured to provide high-linear amplified input currents 104-106 and alternatively or additionally to match impedances of the bipolar transistors Q2, Q3, Q4 to an impedance of a load connected to the output terminal 108 (not illustrated in FIG. 4). The elements of the matching network 301 can be individually adjusted so as to provide individual matching and linearity behavior of the different gain modes. The first bipolar transistor Q2, for example, may be configured to provide the highest gain mode, the second bipolar transistor Q3, for example, may be configured to provide the second highest gain mode and the third bipolar transistor Q4, for example, may be configured to provide the lowest gain mode. In one embodiment of the invention the coupling capacitor C1 and the series connection of the resistor R1 and the inductor L2 may be configured to match an impedance of the first bipolar transistor Q2 (providing the highest gain mode) to an impedance of an external load connected to the output terminal 108. The coupling capacitor C4, the series connection of the resistor R2 and the inductor L4 and the series connection of the resistor R3 and the inductor L5 may be configured to provide high linear amplified input currents 105, 106 in the low gain modes of the multiple gain step low noise amplifier 400. Also other matching combinations are possible. Each output of the network 103 may be individually adjusted for providing optimum impedance matching or high linearity behavior respectively.

Alternatively or additionally to the elements of the matching network 301 also the elements of the directional coupler 107 can be used to achieve good matching results or high linearity behavior respectively. The directional coupler 107 is configured to provide low noise figures for the respective gain modes at the output terminal. Also input and output return losses are independently adjustable. The noise figures can be individually minimized by matching the elements of the directional coupler 107. As each current path can be individually adjusted by separate elements of the matching network 301 and separate elements of the directional coupler 107 an individual configuration of the different gain modes can be achieved. The linearity of a switched amplified input current 104-106 provided at the output terminal 108 is improved with reducing the gain for amplifying the input current 102. In embodiments of the invention no signal power is dumped to a supply voltage and no shunting circuit is used, therefore no signal energy is lost resulting in improved linearity with reducing the gain.

In this embodiment of the invention the input current 102 is provided by a transconductance device 201 which has an output connected to the input terminal 101. The transconductance device 201 comprises a bipolar transconductance transistor Q1 having an emitter terminal connected to a reference node 205 that lies on a reference voltage, for example, a ground voltage. The bipolar transconductance transistor Q1 comprises a collector terminal that is connected to the input terminal 101. The bipolar transconductance transistor Q1 further comprises a base terminal that is connected via a transconductance capacitor C5 to a transconductance input signal 202 that may correspond to "RF IN" according to FIG. 1-3. The base terminal of the bipolar transconductance transistor Q1 is further connected via a transconductance inductor L1 to a transconductance control node 425. The transconductance control node 425 is directly connected to a base terminal and a collector terminal of a bipolar transconductance second transistor Q5. An emitter terminal of the bipolar transconductance second transistor Q5 is connected to the reference node 205 that lies on a reference potential, for example, a ground potential. The transconductance control node 425 is further connected to a transconductance current source "I_DC" 423. The transconductance current source 423 provides a transconductance control current 426 between the reference node 205 and the transconductance control node 425. The elements of the transconductance device 201 are configured to transform the input power of a transconductance input signal 202 at the transconductance input port into the input current 102. The elements are further configured to provide the input current 102 with improved linearity and a high dynamic range.

Although embodiments of the invention were described on the basis of bipolar transistors, it is noted that the invention is not limited to such embodiments. Instead of bipolar transistors also field effect transistors, high electron mobility transistors, junction field effect transistors, conductor field effect transistors, insulated gate bipolar transistors, hetero junction bipolar transistors, thyristors or other kinds of transistors may be used.

Figure 5:
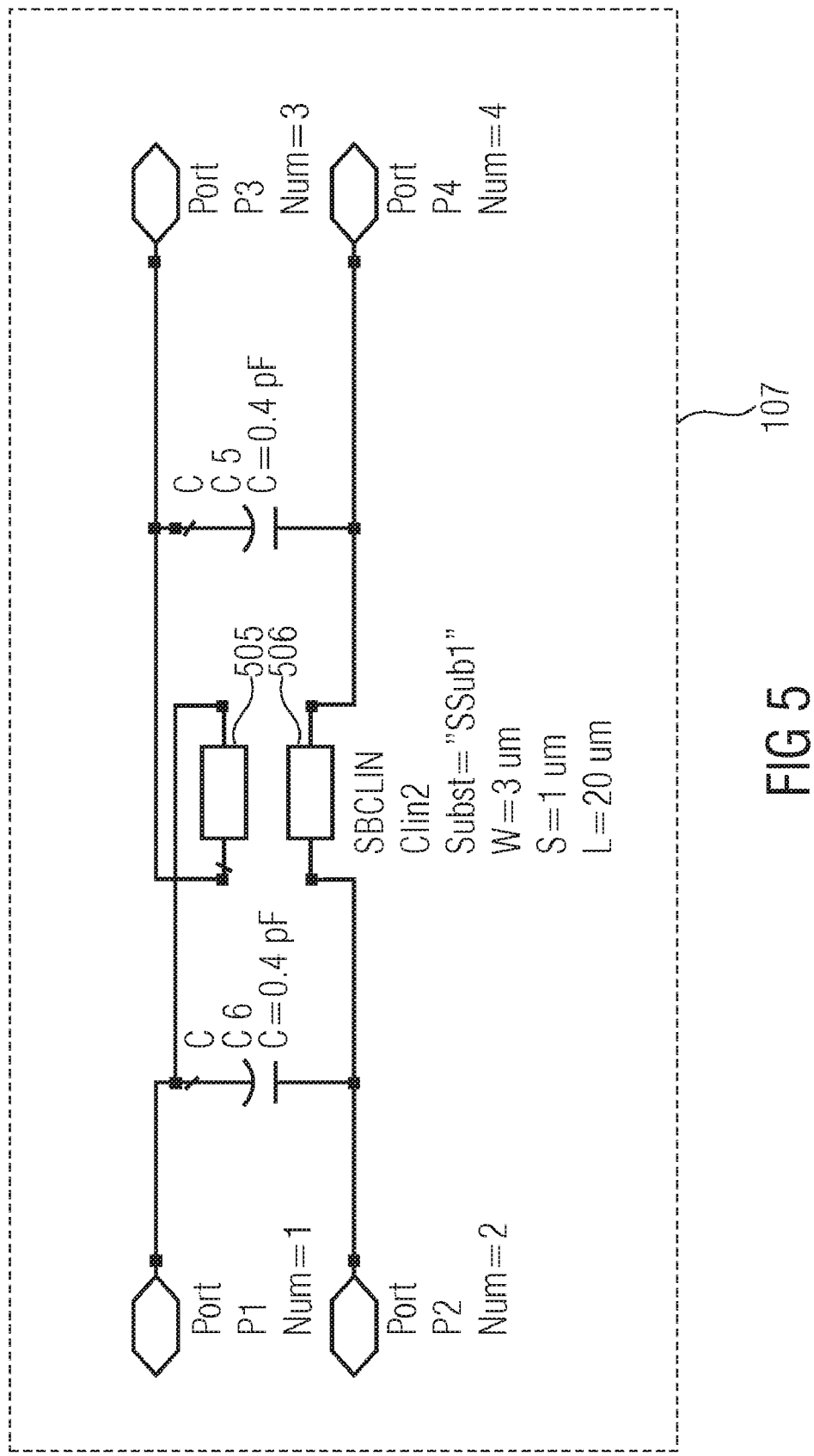
FIG. 5 shows a circuit diagram of a directional coupler according to an embodiment of the invention.

FIG. 5 shows a circuit diagram of a directional coupler according to an embodiment of the invention. The directional coupler 107 corresponds to the directional coupler 107 according to embodiments illustrated in the previous figures. The directional coupler 107 comprises a through port P1, a coupled port P4, an isolated port P2 and an output port P3. As can be seen in FIG. 5 the design of the directional coupler 107 is a symmetrical design. Therefore, the functionality of the different ports can be interchanged. For example, port P3 can be the through port, port P1 can be the output port, port P4 can be the isolated port and port P2 can be the coupled port. In another embodiment port P1 can be the isolated port, port P2 can be the through port, port P3 can be the coupled port and port P4 can be the output port. In another embodiment port P1 can be the coupled port, port P4 can be the through port, port P3 can be the isolated port and port P2 can be the output port.

The directional coupler 107 comprises a first coupling element 505 connected between port P1 and port P3. Port P1 is connected to an output of the first coupling element 505 and port P3 is connected to an input of the first coupling element 505. A second coupling element 506 is connected between port P2 and port P4, wherein an input of the second coupling element 506 is connected to port P2 and an output of the second coupling element 506 is connected to port P4. The coupling elements 505, 506 are configured to implement two passive transmission lines set close enough together such that energy passing through one is coupled to the other. In some embodiments one of the transmission lines is designed for high power operation, while the other transmission line is designed for low power operation. Since the directional coupler 107 is a linear device, any port can be the input, which will result in the directly connected port being the transmitted port or the through port respectively, the adjacent port being the coupled port, and the diagonal port being the isolated port. The directional coupler 107 may, but does not have to, comprise two coupling capacitors C6 and C5 to shorten the length of the two coupling elements 505, 506. The directional coupler 107 can be an on-chip coupler and can be configured to have a coupling factor, for example, in the range of 8 to 16 dB. The directional coupler 107 may, for example, have an isolation around 20 dB and a frequency range of around 1-5 GHz. The directional coupler 107 may be configured to couple signals in a line type or a lumped type way. The directional coupler 107 may couple signals as a combination of coupled lines 505, 506 and capacitors C6, C5 for shortening a length of the directional coupler 107. The directional coupler 107 may be configured to have a noise figure at the output port that is independent of the input signal connected to any other port that serves as input port. Also an input and an output return loss of the output port is independent of signals at the input ports.

In an embodiment of the invention the coupling elements 505, 506 of the directional coupler 107 may be realized on-chip and have a width of around 3 micrometers, a length of around 20 micrometers and a depth of around 1 micrometer. The coupling capacitors C6 and C5 for shortening the length of the directional coupler 107 may have a capacitance of 0.4 pF.

Embodiments of the invention described in FIGS. 1-5 provide a multiple gain step low noise amplifier with improved linearity able to keep the noise figure, the input and output return loss independent of the gain step and to improve the linearity with reducing the gain. While cascade low noise amplifiers are used due to their superior gain and very good reverse transmission, gain steps are implemented mostly through changing the current through the common base transistor by shunting and as a result the output return loss and the linearity degrade. Embodiments of the invention allow independent selection of the gain and linearity of each state without effecting significantly the other parameters. One basic idea behind embodiments of the invention is to exploit the properties of coupled lines or lumped element coupler to combine signals from several amplifier stages. Basically, the signal is combined via a directional coupler. For a coupler with a coupling factor K (for example, value in dB −8 to −10 dB, isolation around 20 dB for on-chip couplers in the range of 1 to 6 GHz) and first stage gain G the overall gain will be G*G1*(1−K) for gain step 1, typically 15 to 20 dB is required, G*G2*K for gain step 2, typically 7 to 12 dB and G*G3*Isolation for gain step 3, typically 2 to 3 dB. An embodiment of the invention provides a cascade low noise amplifier as illustrated in FIG. 4, consisting of a transistor Q1 in common emitter and common base Q2, Q3 and Q4 buffer amplifiers, one for each gain step. Switching between gain steps is done by applying bias voltage to the corresponding transistor or a combination of them. An embodiment of a directional coupler may combine the signal from the three stages as follows: Q2 and its matching are dimensioned for the highest and impedance close to the system impedance even in an off state. Its output is connected to the amplifier output via the couplers direct port. Q3 provides the medium gain step and is connected to the coupler's coupled port. It is practical to choose the coupling factor in the range of 8 to 16 dB. When Q3 is active, the overall gain is determined by the product of the gains of Q1 and Q3 and the coupling factor with the mismatch on the coupler ports taken in account. Q4 is connected to the isolated port and provides the lowest gain step (in the range of a few dB) the overall gain will be reduced by the coupler isolation. The impedance of Q3 and Q4 should be dimensioned to achieve good linearity and should not necessarily match to the system impedance since the coupling factor will improve the mismatch at the output. The coupler can be coupled line type, lumped type or combination like coupled lines with capacitors for shortening the length. The invention principle is valid for any type of transistor low noise amplifier like FET, HEMT etc.

Embodiments of the invention can be applied for Digital Video Broadcast (DVB) Low Noise Amplifiers and other Low Noise Amplifiers for digitally modulated signals.

What is claimed is:

1. An apparatus, comprising:
   an input terminal configured to receive an input signal;
   a network coupled to the input terminal and configured to provide a plurality of amplified input signals; and
   a directional coupler coupled to the network and comprising a through port, a coupled port and an isolated port coupled to the network and an output port coupled to an output terminal;
   wherein the network comprises:
   a first amplifier coupled between the input terminal and the through port of the directional coupler, the first amplifier comprising a first gain and an output for a first amplified input signal;
   a second amplifier coupled between the input terminal and the coupled port of the directional coupler, the second amplifier comprising a second gain and an output for a second amplified input signal; and
   a third amplifier coupled between the input terminal and the isolated port of the directional coupler, the third amplifier comprising a third gain and an output for a third amplified input signal.

2. The apparatus of claim 1, comprising an enable circuit coupled to the first, second and third amplifiers and configured to selectively enable one of the first, second and third amplifiers.

3. The apparatus of claim 2, wherein each of the first, second and third amplifiers comprises an enable input coupled to the enable circuit.

4. The apparatus of claim 1, comprising a transconductance device configured to generate the input signal.

5. The apparatus of claim 4, wherein the transconductance device comprises an amplifier comprising an input for an input current and an output for an amplified input current as the input signal.

6. The apparatus of claim 1, wherein the directional coupler comprises a lumped element coupler or a line coupler.

7. A multiple gain step low noise amplifier, comprising:
   a low noise amplifier comprising an RF input for an input current and an output for an amplified input current;
   a directional coupler comprising a through port, a coupled port, an isolated port and an output port;
   a first amplifier comprising a first gain, an enable input, an input coupled to the low noise amplifier output and an output coupled to the through port of the directional coupler;
   a second amplifier comprising a second gain, an enable input, an input coupled to the low noise amplifier output and an output coupled to the coupled port of the directional coupler;
   a third amplifier comprising a third gain, an enable input, an input coupled to the low noise amplifier output and an output coupled to the isolated port of the directional coupler; and
   a switching element coupled to the enable inputs of the first, second and third amplifiers, the switching element being configured to selectively supply an enable signal to one of the first, second and third amplifiers.

8. The multiple gain step low noise amplifier of claim 7, wherein the enable input of each of the first, second and third amplifiers is configured to receive a bias signal, wherein the switching element is coupled between a power supply and the enable inputs of the first, second and third amplifiers and configured to a selectively supply a power supply signal to one of the first, second and third amplifiers.

9. The multiple gain step low noise amplifier of claim 8, wherein the low noise amplifier and the first, second and third amplifiers comprise operational amplifiers.

10. The multiple gain step low noise amplifier of claim 7, wherein the enable input of each of the first, second and third amplifiers is coupled to receive a control signal, wherein the switching element is configured to selectively supply a control signal to one of the first, second and third amplifiers.

11. The multiple gain step low noise amplifier of claim 10, wherein the low noise amplifier and the first, second and third amplifiers comprise a field effect transistor or a bipolar transistor.

12. The multiple gain step low noise amplifier of claim 11, wherein the low noise amplifier and the first, second and third amplifiers each comprise a high electron mobility transistor (HEMT), a junction field effect transistor (JFET), a metal oxide semiconductor field effect transistors (MOSFET), an insulated gate bipolar transistors (IGBT), a hetero junction bipolar transistor (HJBT) or a thyristor.

13. The multiple gain step low noise amplifier of claim 11,
   wherein the first, second and third amplifiers comprise bipolar transistors,
   wherein base terminals of the first, second and third amplifiers are coupled to the switching element,
   wherein emitter terminals of the first, second and third amplifiers are coupled to the low noise amplifier output,
   wherein a collector terminal of the first amplifier is coupled to the through port of the directional coupler;
   wherein a collector terminal of the second amplifier is coupled to the coupled port of the directional coupler; and
   wherein a collector terminal of the third amplifier is coupled to the isolated port of the directional coupler.

14. The multiple gain step low noise amplifier of claim 7, wherein the directional coupler is of a coupled line type, lumped type or a combination of coupled lines and capacitors.

15. The multiple gain step low noise amplifier of claim 7, wherein the directional coupler is an on-chip coupler comprising a coupling factor between about 8 dB and about 16 dB, an isolation of about 20 dB and an operating frequency between about 1 GHz and about 6 GHz.

16. The multiple gain step low noise amplifier of claim 7, comprising:
  a matching network coupled to the outputs of the first, second and third amplifiers,
  wherein the matching network is configured to match the first amplifier to the system impedance and to match the second and third amplifiers for good linearity.

17. The multiple gain step low noise amplifier of claim 16, wherein the matching network comprises capacitors connected between the output of the first amplifier and the through port, between the output of the second amplifier and the coupled port and between the output of the third amplifier and the isolated port; wherein the matching network comprises series connections of a resistor and an inductor, the series connections connected between the outputs of the first, second and third amplifiers and a supply node, the supply node providing a supply voltage.

18. An apparatus, comprising:
  means for receiving an input signal;
  means for providing a plurality of amplified input signals, the means for providing comprising first means for amplifying the input signal using a first gain to generate a first amplified input signal, second means for amplifying the input signal using a second gain to generate a second amplified input signal; and third means for amplifying the input signal using a third gain to generate a third amplified input signal; and
  means for directionally coupling one of the plurality of amplified input signals to an output, the means for directionally coupling comprising a through port, a coupled port and an isolated port for receiving a respective one of the amplified input signals, and an output port.

19. The apparatus of claim 18, comprising means for selectively enabling one of the first, second and third means for amplifying.

20. The apparatus of claim 18, comprising means for generating the input signal, wherein the means for generating the input signal comprises amplifying means for providing an amplified input current as the input signal.

21. The apparatus of claim 18, wherein the means for directionally coupling comprises lumped elements or coupled lines.

* * * * *